United States Patent
Popp et al.

(10) Patent No.: US 10,544,047 B2
(45) Date of Patent: Jan. 28, 2020

(54) METHOD FOR PRODUCING POLYCRYSTALLINE SILICON

(71) Applicant: Wacker Chemie AG, Munich (DE)

(72) Inventors: Friedrich Popp, Ooltewah, TN (US); Harald Hertlein, Burghausen (DE)

(73) Assignee: WACKER CHEMIE AG, Munich (DE)

( * ) Notice: Subject to any disclaimer, the term of this patent is extended or adjusted under 35 U.S.C. 154(b) by 228 days.

(21) Appl. No.: 15/505,191

(22) PCT Filed: Aug. 10, 2015

(86) PCT No.: PCT/EP2015/068362
§ 371 (c)(1),
(2) Date: Feb. 20, 2017

(87) PCT Pub. No.: WO2016/026728
PCT Pub. Date: Feb. 25, 2016

(65) Prior Publication Data
US 2017/0305748 A1     Oct. 26, 2017

(30) Foreign Application Priority Data

Aug. 18, 2014   (DE) .......................... 10 2014 216 325

(51) Int. Cl.
| | | |
|---|---|---|
| *C01B 33/035* | (2006.01) | |
| *C23C 16/01* | (2006.01) | |
| *C23C 16/02* | (2006.01) | |
| *C23C 16/24* | (2006.01) | |

(52) U.S. Cl.
CPC ............ *C01B 33/035* (2013.01); *C23C 16/01* (2013.01); *C23C 16/0227* (2013.01); *C23C 16/24* (2013.01)

(58) Field of Classification Search
None
See application file for complete search history.

(56) References Cited

U.S. PATENT DOCUMENTS

| | | | |
|---|---|---|---|
| 6,296,716 B1 | 10/2001 | Haerle et al. | |
| 7,452,475 B2 * | 11/2008 | Tan ..................... | C23C 16/4404 134/1 |
| 7,927,571 B2 | 4/2011 | Altmann et al. | |
| 2003/0234029 A1* | 12/2003 | Bergman ............... | B08B 3/045 134/1 |
| 2006/0201536 A1* | 9/2006 | Solcz ........................ | B08B 3/02 134/33 |
| 2008/0038178 A1* | 2/2008 | Altmann ............... | C01B 33/029 423/348 |
| 2009/0093107 A1* | 4/2009 | Lee ...................... | C11D 3/0073 438/584 |
| 2011/0206842 A1* | 8/2011 | Revankar .............. | C01B 33/035 427/248.1 |
| 2011/0226628 A1 | 9/2011 | Kraus | |
| 2012/0048178 A1 | 3/2012 | Schaefer et al. | |
| 2013/0011581 A1 | 1/2013 | Mueller et al. | |

FOREIGN PATENT DOCUMENTS

| | | |
|---|---|---|
| EP | 1886971 A1 | 2/2008 |
| EP | 2067744 A2 | 6/2009 |
| EP | 2077252 A2 | 7/2009 |
| EP | 2583943 A1 | 4/2013 |
| JP | 2012101984 A2 | 5/2012 |
| JP | 2013018675 A | 1/2013 |

OTHER PUBLICATIONS

English Machine Translation of JP 2013/018675A.*

* cited by examiner

*Primary Examiner* — Nicole Blan
(74) *Attorney, Agent, or Firm* — Brooks Kushman P.C.

(57) ABSTRACT

The rate of rod fallover in the production of polycrystalline silicon by the Siemens process is sharply reduced by cleaning the Siemens reactor base plate by at least a two-step procedure comprising suctioning the base plate in one step, and subsequently cleaning with liquid or solid cleaning medium in a second step, between each phase of rod removal and new support body installation.

5 Claims, No Drawings

METHOD FOR PRODUCING POLYCRYSTALLINE SILICON

CROSS REFERENCE TO RELATED APPLICATIONS

This application is the U.S. National Phase of PCT Appln. No. PCT/EP2015/068362 filed Aug. 10, 2015, which claims priority to German Application No. 10 2014 216 325.0 filed Aug. 18, 2014, the disclosures of which are incorporated in their entirety by reference herein.

BACKGROUND OF THE INVENTION

1. Field of the Invention

The invention relates to a process for producing polycrystalline silicon

2. Description of the Related Art

Polycrystalline silicon is typically produced by the Siemens process. This comprises introducing a reaction gas comprising one or more silicon-comprising components and optionally hydrogen via nozzles into a reactor comprising support bodies heated by direct passage of current to deposit solid silicon on the support bodies. Silicon-comprising components employed are preferably silane ($SiH_4$), monochlorosilane ($SiH_3Cl$), dichlorosilane ($SiH_2Cl_2$), trichlorosilane ($SiHCl_3$), tetrachlorosilane ($SiCl_4$) or mixtures thereof.

The Siemens process is typically carried out in a deposition reactor (also known as a "Siemens reactor"). In the most commonly used embodiment the reactor comprises a metallic bottom plate and a coolable bell jar disposed upon the bottom plate, thus forming a reaction space inside the bell jar. EP 2 077 252 A2 describes the typical construction of a reactor type used in the production of polysilicon.

The bottom plate comprises one or more gas inlet openings and one or more offgas openings for reaction gases and also holders which assist in holding the support bodies in the reaction space and supplying said support bodies with electric current via electrodes.

Each of the support bodies is typically formed from two so-called "slim rods" and a horizontal bridge. The bridge coupling affords the support bodies their typical U-shape. The support bodies are typically made of polycrystalline silicon. The slim rods upon which polycrystalline silicon is deposited may be several meters long (approximately 2 to 3 meters is typical).

In EP 2 077 252 A2 it is seen as advantageous in terms of process engineering to bring nozzles for the reaction gas supply on- and off-line during the deposition process. This is accomplished by adjusting the proportion of closed nozzles as a function of process time or rod diameter. This measure aims to ensure an optimal gas supply to all rods—particularly in the upper region—as rod diameter increases.

EP 2 067 744 A2 discloses a production process for polycrystalline silicon where after an initial stabilization step the inflow velocity of the reaction gas by which silicon is deposited is increased, first sharply and then more slowly, to improve the supply of reaction gas to the support bodies, and subsequently reduced in the growth step to ensure efficient deposition. It is emphasized that only the supply of reaction gas is adjusted and that there is thus no need for any modifications whatsoever to the reactors.

However, the processes described in EP 2 077 252 A2 and EP 2 067 744 A2 exhibit an increased incidence of rods falling over in the reactor. This is presumably related to the abrupt changes in inflow velocities of the reaction gas.

Rods falling over may also knock over other neighboring rods. This causes considerable economic damage, particularly when the silicon rods falling over damage the reactor wall. The silicon rods that have fallen over are contaminated by the contact with the reactor wall and require surface cleaning. The removal from the reactor of batches that have fallen over is moreover only possible using a more costly procedure. This further contaminates the surface of the silicon.

US 20120048178 A1 discloses a process for producing polycrystalline silicon where an archimedes number describing flow conditions in the reactor is within certain ranges depending on the fill level "FL". This results in a lower fallover rate compared to the process according to EP 2 067 744 A2.

The prior art also reports lower fallover rates when specific electrodes are employed.

Electrodes typically consist of a cylindrical base body lower part and a cone point upper part. The cone point comprises a bore for accommodating the slim rod. The lower end of the electrode is placed in a metallic electrode holder which is used to supply the current.

According to US 2011226628 A1 it was found that, surprisingly, an electrode made of carbon having a conical or pyramidal point surrounded by a raised edge exhibits improved heat removal and improved distribution of current density in relation to rod thickness during growth of the slim rod secured therein.

For an electrode of this type, as for a standard electrode, at the beginning of a deposition of polysilicon onto a slim rod, i.e. when the rod diameter is still narrow, the rod base initially grows only onto the tip. When an electrode material having a low specific thermal conductivity is employed the degree of heat removal via the electrode is low for a narrow rod diameter. The electrode tip thus readily fuses with the electrode and rapidly grows into the rod base. This ensures a high level of stability even at the beginning of the deposition and minimizes the risk of rods falling over before achieving their final diameter.

US 2013011581 A2 discloses an apparatus for protecting electrode holders in CVD reactors comprising an electrode suitable for accommodating a slim rod on an electrode holder which is made of an electrically conductive material and is installed in a recess of a bottom plate, wherein an intermediate space between the electrode holder and the bottom plate is sealed by means of a sealing material and the sealing material is protected by a protective body which is made up of one or more parts and is arranged in a ring-like manner around the electrodes, wherein the height of the protective body increases at least in sections in the direction of the electrode holder.

This arrangement of the protective body permits rapid and uniform growth of silicon on the rod base. It has been found that the nonuniform growth of silicon which is often observed in the prior art and can lead to the rod falling over can largely be prevented in this way, i.e. a reduction in the fallover rate is achieved.

It is thus known from the prior art to reduce fallover rates by choosing suitable flow conditions in the reactor or by using specific electrodes.

U.S. Pat. No. 7,927,571 B2 discloses a procedure which comprises performing, once a desired diameter has been achieved, the steps of terminating the deposition, cooling down the polycrystalline silicon rods formed to room temperature, then opening the bell jar and removing, using extraction aids, the polycrystalline silicon rods for further processing and subsequently cleaning the bell jar and bottom plate of the reactor and providing said bell jar and bottom plate with new electrodes and slim rods for the next deposition batch.

SUMMARY OF THE INVENTION

The invention has for its object to further reduce the fallover rates for polycrystalline silicon rods in the deposition of polycrystalline silicon. This and other objects are achieved by a process for producing polycrystalline silicon where polycrystalline silicon is deposited on support bodies heated by direct passage of current to afford polycrystalline silicon rods, wherein the support bodies are held on a bottom plate of a reactor and supplied with current via electrodes, wherein the deposition of polycrystalline silicon is terminated when the polycrystalline silicon rods have achieved a desired final diameter, wherein the polycrystalline silicon rods are subsequently removed from the reactor and the reactor is fitted with new support bodies to afford further polycrystalline silicon rods, wherein after removal of the polycrystalline silicon rods from the reactor and before fitting of the reactor with new support bodies the bottom plate of the reactor is cleaned, wherein a cleaning of the bottom plate comprising at least two cleaning steps is carried out, wherein the at least two cleaning steps employ at least two cleaning media in different physical states. Surprisingly, such a specific cleaning of the reactor bottom plate markedly reduces the fallover rate.

DETAILED DESCRIPTION OF THE PREFERRED EMBODIMENTS

It is essential that at least two cleaning media in different physical states (solid, liquid, gaseous) are employed. Neither mere wet cleaning nor mere treatment with gaseous media results in the desired effect.

It is preferable when the cleaning of the bottom plate is carried out with one gaseous cleaning medium and one liquid cleaning medium. Likewise preferable is the use of one solid-containing cleaning medium and one liquid cleaning medium. A further preferred version of the process comprises using one solid-containing cleaning medium and one gaseous cleaning medium.

The at least two cleaning steps with different cleaning media may be performed in any desired sequence.

It is preferable when a liquid cleaning medium employed in the context of the process comprises water. Said cleaning medium preferably comprises ion-free water (IF water). It is likewise preferable to employ a liquid cleaning medium comprising an alcohol.

A gaseous cleaning medium preferably comprises nitrogen. In the simplest case said medium is air, preferably cleanroom air When a solid-containing cleaning medium is employed, it is preferable when the cleaning medium comprises an oxide. Said oxide is preferably selected from silicon dioxide, aluminum oxide, carbonates, silicates, talc and pumice.

It is preferable to carry out a cleaning of the bottom plate comprising at least two cleaning steps wherein the at least two cleaning steps employ at least two cleaning media in different physical states, at least after every six rod removal procedures and before every sixth installation procedure. After every deposition procedure, the polycrystalline silicon rods afforded are removed from the reactor (rod removal). The term installation procedure is to be understood as meaning that the reactor is fitted with new support bodies by introducing new support bodies into the reactor, connecting said bodies to the electrodes and fixing said bodies to the bottom plate.

It is particularly preferable to carry out a cleaning of the bottom plate after three or after two rod removal procedures. It is most preferable to carry out the cleaning of the bottom plate after every deposition procedure and subsequent rod removal.

One embodiment comprises carrying out a cleaning of the bottom plate with a gaseous cleaning medium after every rod removal procedure. In the simplest case this comprises suctioning-off the bottom plate (cleaning medium is air which is suctioned off). After every sixth rod removal procedure a cleaning of the bottom plate is carried out, said cleaning comprising two steps. The first step comprises suctioning-off the bottom plate. In the second step a cleaning of the bottom plate with a liquid or solid or solid-containing cleaning medium is carried out.

A further preferred embodiment comprises carrying out a cleaning of the bottom plate with a gaseous cleaning medium after every rod removal procedure. In the simplest case this comprises suctioning-off the bottom plate. In addition, the cleaning with the gaseous cleaning medium is always followed by a cleaning of the bottom plate with a liquid or solid or solid-containing cleaning medium.

Particular preference is given to a suctioning-off of the bottom plate with a subsequent wet cleaning.

The bottom plate is preferably dried after any cleaning with a liquid cleaning medium. This may be achieved by flowing a gas comprising nitrogen, in the simplest case air, preferably cleanroom air, to the bottom plate. It is likewise possible to use a liquid which promotes the evaporation of water to dry the bottom plate. The bottom plate is preferably dried by supplying an alcohol. Drying the bottom plate avoids discoloration on the polycrystalline silicon rods which is evident when residual moisture remains on the bottom plate after a wet cleaning of the bottom plate.

Cleaning may be carried out manually. The bottom may likewise be cleaned using automatic cleaning machines such as brush roll vacuum cleaners, wet vacuum cleaners and vacuum cleaners, sweeping machines, vacuum polishing machines, single-disc polishing machines.

It is preferable when the cleaning of the bottom plate is carried out using a cleaning means selected from the group consisting of a polishing machine, sponge, polishing cloth, cleaning cloth, brush, vacuum cleaner, dustpan and broom. Particular preference is given to using a polishing cloth or a polishing machine.

Preference is given to sealing openings in the bottom plate before the cleaning. It is particularly preferable when the openings are sealed so as to be impervious to gas and water. Suitable therefor are stoppers or caps for example.

Certain malfunction rates, in particular the fallover rate, do not increase for identical deposition recipes when applying the invention. Moreover, the material is not contaminated by tarnish colors in the inventive handling of the bottom plates.

In terms of the deposition of polycrystalline silicon, it is preferable to employ the process described in US 20120048178 A1. US 20120048178 A1 is hereby incorporated herein in its entirety.

In terms of the electrodes employed in the deposition, US 2013011581 A2 and US 2011226628 A2 are hereby incorporated herein in their entirety. The use of such electrodes which is preferred in the context of the invention ensures uniform growth of the silicon at the rod base.

The features cited in connection with the abovedescribed embodiments of the process according to the invention may be implemented either separately or in combination as embodiments of the invention. Said features may further describe advantageous embodiments eligible for protection in their own right.

EXAMPLES

Example 1

In a sample 1 every rod removal was followed by suctioning-off of the bottom plate (gaseous cleaning medium/air) and subsequent wet cleaning of the bottom plate.

In a sample 2 every rod removal was followed by suctioning-off of the bottom plate but additional wet cleaning was carried out only after every sixth rod removal.

For both samples the fallover rates F1 for thin rods (diameter less than 100 mm) and the fallover rates F2 for thick rods (diameter more than 100 mm) were determined.

The results are shown in Table 1.

For thin rods, sample 2 shows a fallover rate 100% higher than that for sample 1. For thick rods, the fallover rate for sample 2 is 70% higher than the reference value for sample 1.

The deposition procedure and the graphite electrodes employed (deposition recipe A) were identical for both samples.

TABLE 1

| Sample | Deposition recipe | Cleaning cycle (wet cleanings/operating runs) | F1 | F2 |
|---|---|---|---|---|
| 1 | A | 1/1 | x | y |
| 2 | A | 1/6 | 2x | 1.7y |

The purpose of this example is to show that the type of cleaning has a significant effect on the fallover rate. The fallover rates compared to sample 2 would be many times higher without inventive cleaning of the bottom plate.

As shown by the results for sample 1, each rod removal should ideally be followed both by suctioning off of the bottom plate and by subsequent wet cleaning of the bottom plate. This results in minimal fallover rates.

A bottom plate that has not been wet cleaned exhibits a lower reflectance than a bottom plate that has been wet cleaned. Since less heat is reflected back to the rod bases by the bottom plate that has not been wet cleaned, the rod bases have a colder surface than for a wet-cleaned bottom plate. A wet-cleaned bottom plate is able to reflect back more heat. Since the temperatures inside the rod bases are identical for an identical deposition recipe, different temperature gradients result. The higher temperature gradient for bottom plates that have not been wet cleaned may be responsible for a higher fallover rate.

Example 2

Samples 3 and 4 were also analyzed. For both samples suctioning-off of the bottom plate, wet cleaning of the bottom plate with water and subsequent drying of the bottom plate were carried out.

For sample 3, the offgas and feed gas openings of the bottom plate were sealed so as to be impervious to gas and water before wet cleaning. This was eschewed for sample 4.

The deposition procedure and the graphite electrodes employed (deposition recipe A) were identical for both samples as in Example 1.

It was apparent that the rate of batches exhibiting discoloration caused by water in sample 4 was about 10 times higher than in sample 3. This is also shown in Table 2.

TABLE 2

| Sample | Deposition recipe | Discoloration rate |
|---|---|---|
| 3 | A | x |
| 4 | A | 10x |

It is assumed that even small amounts of moisture which enter the openings in the bottom plate during cleaning and are not fully removed in the drying step can cause such discolorations in the polycrystalline silicon rods.

The description hereinabove of illustrative embodiments is to be understood as being exemplary. The disclosure made thereby enables a person skilled in the art to understand the present invention and the advantages associated therewith and also encompasses alterations and modifications to the described process obvious to a person skilled in the art. All such alterations and modifications and also equivalents shall therefore be covered by the scope of protection of the claims.

The invention claimed is:

1. In a process for producing polycrystalline silicon where polycrystalline silicon is deposited on support bodies heated by direct passage of current to produce polycrystalline silicon rods, wherein the support bodies are held on a bottom plate of a reactor and supplied with current via electrodes, wherein the deposition of polycrystalline silicon is terminated when the polycrystalline silicon rods have achieved a desired final diameter, wherein the polycrystalline silicon rods are subsequently removed from the reactor and the reactor is fitted with new support bodies to afford further polycrystalline silicon rods, the improvement comprising cleaning the bottom plate of the reactor after removal of the polycrystalline silicon rods from the reactor and before fitting of the reactor with new support bodies, wherein the cleaning comprises at least suctioning off the bottom plate and subsequently further cleaning the bottom plate with a liquid or solid-containing cleaning medium, after every rod removal procedure,
wherein before the cleaning of the bottom plate, openings in the bottom plate are sealed so as to be impervious to gas and water.

2. The process of claim 1 wherein following suctioning off the bottom plate, the bottom plate is cleaned with ion-free water.

3. The process of claim 2, wherein following cleaning with ion-free water, an alcohol is added to assist in drying the bottom plate.

4. The process of claim 1, wherein when a solid-containing cleaning medium is employed, the solid-containing cleaning medium is an oxide selected from the group consisting of silicon dioxide, aluminum oxide, carbonates, silicates, talc, pumice, and mixtures thereof.

5. In a process for producing polycrystalline silicon where polycrystalline silicon is deposited on support bodies heated by direct passage of current to produce polycrystalline silicon rods, wherein the support bodies are held on a bottom plate of a reactor and supplied with current via electrodes, wherein the deposition of polycrystalline silicon is terminated when the polycrystalline silicon rods have achieved a desired final diameter, wherein the polycrystalline silicon rods are subsequently removed from the reactor and the reactor is fitted with new support bodies to afford further polycrystalline silicon rods, the improvement comprising cleaning the bottom plate of the reactor after removal of the polycrystalline silicon rods from the reactor and before fitting of the reactor with new support bodies, wherein the cleaning comprises at least suctioning off the bottom plate and subsequently further cleaning the bottom plate with a liquid or solid-containing cleaning medium, after every rod removal procedure, wherein the cleaning of the bottom plate comprises a cleaning step with a liquid cleaning medium and the bottom plate is dried after this cleaning step, wherein before the cleaning of the bottom plate, openings in the bottom plate are sealed so as to be impervious to gas and water.

\* \* \* \* \*